United States Patent [19]

Cargille

[11] 4,426,591
[45] Jan. 17, 1984

[54] ADAPTIVE COMPARATOR

[75] Inventor: Donald R. Cargille, Venice, Calif.

[73] Assignee: Hughes Aircraft Company, El Segundo, Calif.

[21] Appl. No.: 175,112

[22] Filed: Aug. 4, 1980

[51] Int. Cl.³ ............................................ H03K 5/153
[52] U.S. Cl. ................................... 307/358; 307/308; 307/362; 328/151
[58] Field of Search .............. 307/264, 358, 359, 362, 307/350, 308; 328/147, 149, 151

[56] References Cited

U.S. PATENT DOCUMENTS

| 3,020,407 | 2/1962 | Merlin . | |
|---|---|---|---|
| 3,193,681 | 7/1965 | Schwarz . | |
| 3,359,407 | 12/1967 | Paige . | |
| 3,379,885 | 4/1968 | Nork . | |
| 3,457,410 | 7/1969 | Savoca . | |
| 3,714,432 | 1/1973 | Jalink . | |
| 3,737,790 | 6/1973 | Brown | 307/359 |
| 3,793,518 | 2/1974 | Harper . | |
| 3,825,754 | 7/1974 | Cinzori et al. . | |
| 3,834,653 | 9/1974 | Perkel . | |
| 3,920,994 | 11/1975 | Cargille . | |
| 3,940,753 | 2/1976 | Müller . | |
| 4,056,738 | 11/1977 | Gustafson | 307/359 |
| 4,088,906 | 5/1978 | Hüllwegen | 307/359 |
| 4,114,841 | 9/1978 | Muhlfelder et al. . | |
| 4,119,918 | 10/1978 | Moser | 307/359 |
| 4,155,007 | 5/1979 | Beckmann . | |
| 4,263,555 | 4/1981 | Hunka | 307/359 |

OTHER PUBLICATIONS

The Earth Chord Detection Circuit on the ANIK C/SBS Satellite, (L968), FIG. A.

Primary Examiner—John Zazworsky
Attorney, Agent, or Firm—W. J. Benman, Jr.; W. J. Bethurum; A. W. Karambelas

[57] ABSTRACT

An adaptive comparator is provided which compares a signal from a horizon sensor of a satellite to a predetermined threshold to provide a signal indicative of the relative position of a celestial body with improved noise immunity. When the comparator receives a signal from the horizon sensor which exceeds the threshold, an output is provided which may be used to change the orientation of the spacecraft. The comparator includes circuitry for ascertaining the average of one or more of the most recent input pulses which exceeded the previous threshold. This average is then utilized to set a new or adapted threshold. The subsequent input signal is then compared to the adapted threshold and the recursive process continues.

9 Claims, 1 Drawing Figure

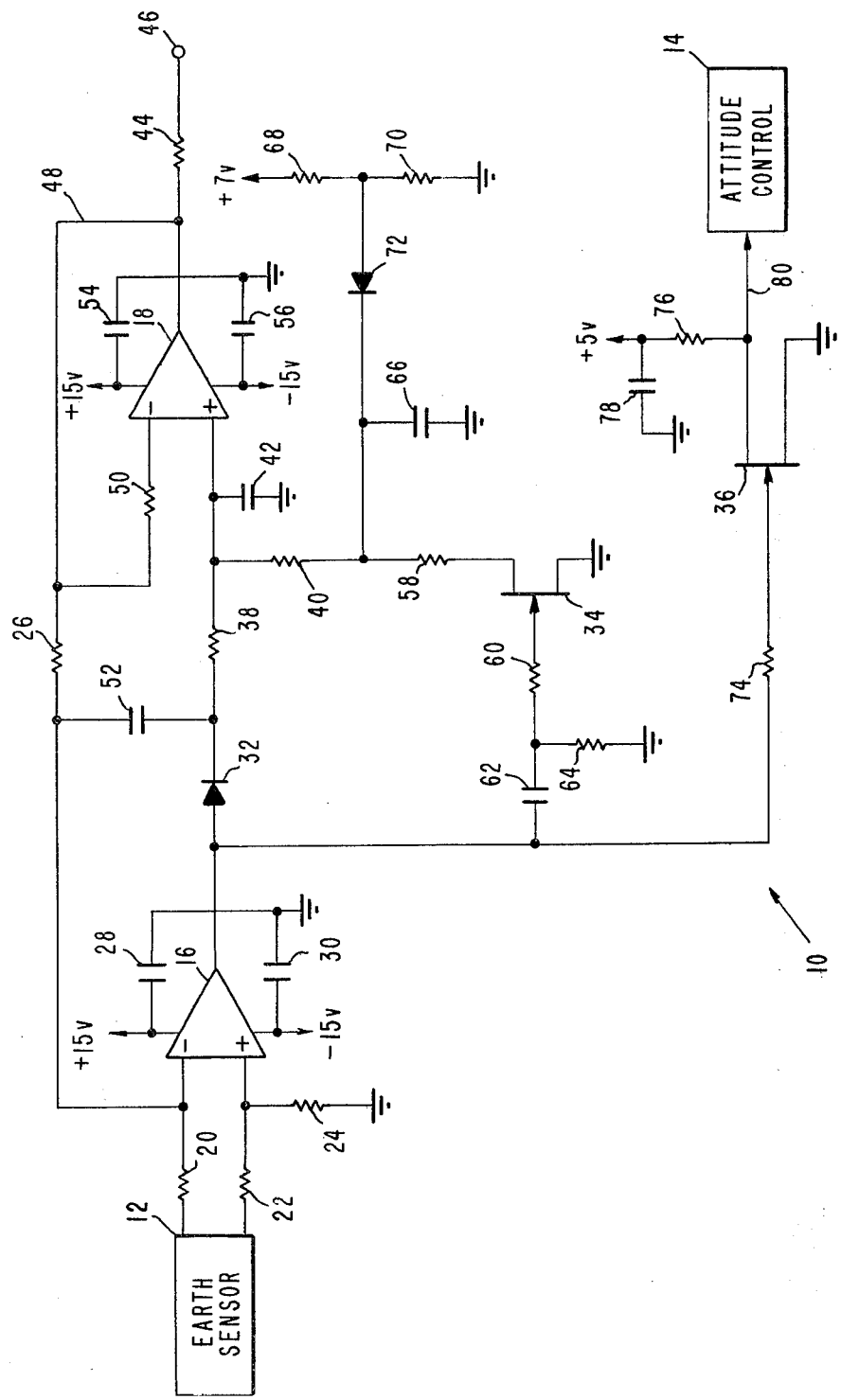

ADAPTIVE COMPARATOR

BACKGROUND OF THE INVENTION

1. Field of the Invention

This invention relates to satellite position control systems. More specifically, this invention relates to earth sensor pulse processors for use on satellites.

While the present invention is described herein with reference to particular embodiments, it should be understood that the invention is not limited thereto. Those having ordinary skill in the art and the teachings of the present invention may recognize the advantages thereof in applications other than those mentioned above.

2. Description of the Prior Art

The position and/or orientation of a satellite or other spacecraft relative to the earth, the sun, the moon, or other celestial bodies is often critical to the success of its mission. To maintain a proper attitude, a satellite may be equipped with means for sensing its orientation relative to a frame of reference. A horizon sensor is such a sensing means.

As shown in U.S. Pat. No. 3,920,994 issued to the applicant in 1975, a horizon sensor typically includes optics and an infrared detector which generates an output whenever a radiant body is in the scanned path. This output may activate motive means to correct the satellite's orientation.

Spurious noise from other radiant bodies may trigger the infrared detector to generate a false output. To solve this problem, pulse processors have been developed which typically employ either a fixed threshold or a peak detector with an adaptive threshold to eliminate such noise effects.

A fixed threshold detector rejects input signals below a predetermined threshold. The threshold may, for example, be one-half the expected amplitude of the input pulse. Unfortunately, the amplitude of the input pulse may vary due to the latitude of the satellite relative to the radiant body, a change in the distance of the satellite from the radiant body, variations in the temperature of the radiant body, degradation of the optics associated with the infrared detector, or degradation of the infrared detector itself.

Since the amplitude of the input signal varies, it is desirable to vary the threshold in response to variations in the input pulse. Thus, it is an object of the present invention to provide a horizon sensor pulse processor with an adaptive threshold.

Peak detectors such as disclosed by Savoca (U.S. Pat. No. 3,457,410) typically differentiate the input signal to determine the peak amplitude. The value thus obtained is then used to set a subsequent threshold. In this sense, peak detectors are adaptive. Unfortunately, a peak detector can become a sun detector in that the input signal may be so great when the sun is detected that the threshold will automatically be set too high for signals corresponding to the earth.

Another disadvantage associated with peak detectors arises in the detection of long or wide pulses which are subject to droop. A peak detector may set the threshold so high as to detect only a portion of such a wide pulse, thus causing an erroneous indication as to the orientation of the satellite.

Thus, it is a still further object of the present invention to provide an adaptive comparator capable of comparing signals from the horizon sensor to an adapted threshold so as to discriminate signals from targets having varying degrees of radiation intensity. It is yet another object of the present invention to provide and adaptive comparator which can accurately detect wide pulses which may be subject to droop.

SUMMARY OF THE INVENTION

The objects of this invention are achieved by an adaptive comparator which compares a signal from the horizon sensor to a predetermined threshold. When a signal is received which exceeds the threshold, an output is provided which may be used to change the orientation of the spacecraft.

The adaptive comparator of the present invention includes circuitry for ascertaining the average of one or more of the most recent input pulses which exceeded the previous threshold. This average is then utilized to set a new or adapted threshold. The circuit of the present invention then compares the input signals to the adapted threshold, whereupon the recursive process continues.

To achieve this, the adaptive comparator of the present invention includes a first circuit for setting a predetermined initial threshold, a second circuit for comparing the input signal to the threshold and for generating an output signal when the input signal exceeds the threshold, and a third circuit coupled to the second circuit for setting a second input signal threshold which corresponds to the average of the input signals which most recently exceeded the previous threshold.

BRIEF DESCRIPTION OF THE DRAWINGS

The FIGURE is a schematic diagram of the preferred embodiment of the invention.

DESCRIPTION OF THE INVENTION

The figure shows schematically the preferred embodiment of the present invention 10 connected between an earth or horizon sensor 12 and an attitude servo-control system 14. The earth sensor 12 and the attitude control system 14 are not part of the present invention. Each is shown for the purpose of illustration only.

The earth sensor 12 is typically a narrow band infrared radiometer mounted on the spinning portion of the satellite. It detects the infrared temperature of the radiant body against the cold space background and produces an analog output pulse. The output pulse thus produced has a peak amplitude proportional to the radiance from the target that is scanned.

The attitude control system typically includes a phase locked loop which generates signals used to control the orientation of the satellite or spacecraft.

The preferred embodiment 10 includes operational amplifiers 16 and 18. Operational amplifier 16 has inputs provided by the earth sensor 12 via resistors 20 and 22. Resistor 24 is connected between the noninverting input of the operational amplifier 16 and ground. Resistor 26 is disposed in a feedback loop between the output of the operational amplifier 18 and the inverting input of the operational amplifier 16. Resistors 20, 22, 24 and 26 are of equal value and form a differential amplifier with operational amplifier 16.

Operational amplifier 16, as shown, is arranged to receive input via resistor 20 and provide a return via resistor 22. This arrangement permits common mode noise to be rejected by differential amplification.

As discussed more fully below, the differential amplifier provided by operational amplifier 16 and resistors 20, 22, 24 and 26 performs as a comparator and a unity gain inverting amplifier during various stages of the operation of the invention.

Bypass capacitors 28 and 30 are connected across the power supply inputs of operational amplifier 16 so that the power supply (not shown) sees a low impedance at high frequencies as well as at low frequencies.

The output of operational amplifier 16 is connected to the anode of diode 32 and the gate circuit of transistors 34 and 36. Diode 32 is connected to the noninverting input of operational amplifier 18 via a current limiting resistor 38. Resistor 38 protects diode 32 against transient current surges.

Resistor 40 and capacitor 42 are also connected to the noninverting input of the operational amplifier 18. As discussed more fully below, capacitor 42 functions to supply reverse recovery to the diode 32. Resistor 44 is provided at the output of the operational amplifier 18 to allow the threshold voltage to be monitored at terminal 46. A feedback loop 48 is also connected between the output of the operational amplifier 18 and the inputs to the operational amplifiers 16 and 18 via feedback resistor 26 and current limiting resistor 50, respectively. Compensation capacitor 52 is connected between the inverting input of operational amplifier 16 and the cathode of diode 32 to provide stability against oscillation resulting from the feedback arrangement.

Bypass capacitors 54 and 56 are provided across the power supply to operational amplifier 18 just as capacitors 28 and 30 are connected with regard to the operational amplifier 16. The function of capacitors 54 and 56 is identical to that of capacitors 28 and 30 as discussed above.

Resistors 40 and 58 are connected to ground via the channel of transistor 34. The gate of transistor 34 is connected to the output of operational amplifier 16 via current limiting resistor 60 and capacitor 62. Resistor 64 is connected between the junction of resistor 60 and capacitor 62 and ground. Resistors 40 and 58 provide a 50% voltage divider with regard to capacitor 66. Capacitor 66 is connected between the common node of resistors 40 and 58 and ground. Resistors 40 and 58 are combined with capacitor 66 to provide an RC filter with a gain of one-half.

Resistors 68 and 70 are connected in series across a power supply (not shown). A diode 72 is connected between the common nodes of resistors 40 and 58 and 68 and 70. The cathode of the diode 72 is connected to the junction of resistors 40 and 58. The anode of the diode 72 is connected to the junction of resistors 68 and 70.

As mentioned above, the output of the operational amplifier 16 is also connected to the gate of the transistor 36 via current limiting resistor 74. A pullup resistor 76 is connected between a power supply (not shown) and the channel of the transistor 36. The output of the present invention is provided on line 80 to the attitude control circuit 14. The channel of transistor 36 is grounded. Bypass capacitor 78 is connected across resistor 76 and the channel of transistor 36.

While transistors 34 and 35 are shown as field effect transistors, it should be understood that any electrical switching component could be used in place of these transistors without departing from the scope of this invention.

Typical values for the components of the adaptive comparator 10 of the present invention are tabulated below.

| Resistor | Values | Capacitor | Values |
| --- | --- | --- | --- |
| 20 | 100K | 28 | 0.1 mf |
| 22 | 100K | 30 | 0.1 mf |
| 24 | 100K | 42 | 330 pf |
| 26 | 100K | 52 | 30 pf |
| 38 | 470 | 54 | 0.1 mf |
| 40 | 499K | 56 | 0.1 mf |
| 44 | 10K | 62 | 1.0 mf |
| 50 | 100K | 66 | 1.0 mf |
| 58 | 499K | 78 | 1.0 mf |
| 60 | 10K | | |
| 64 | 22M | | |
| 68 | 316K | | |
| 70 | 49.9K | | |
| 74 | 100K | | |
| 76 | 2K | | |

In operation, prior to the arrival of the first negative pulse input via resistor 20 to the inverting input of operational amplifier 16, the voltage on capacitor 66 is positive and equal to approximately one-half the magnitude of the pulse expected on the input. The minimum possible value of this voltage was predetermined by the selection of the power supply on resistor 68, the values for resistors 68 and 70, and taking into account the drop across the forward biased diode 72. This "minimum threshold" is set to prevent false indications due to noise when no radiant body is in scan path. Initially, transistor 34 is off and diode 32 is back biased. Operational amplifier 18 is a unity gain follower and since the current in resistor 40 is zero, the voltage at the input to the operational amplifier 18 is the same as that on capacitor 66, that is, one-half the expected input voltage. Since the operational amplifier is a unity gain follower, the voltage at its noninverting input becomes the voltage at its output. Since the voltage on the capacitor is the predetermined threshold voltage, then the predetermined threshold voltage appears at the output of operational amplifier 18. Because of the feedback loop 48, it also appears at one side of resistor 26. Since resistors 20 and 26 are equal, the voltage at the inverting terminal of operational amplifier 16 will be ½ the sum of the input voltage and the threshold voltage at the right side of resistor 26. Therefore, operational amplifier 16 will initially have a positive voltage at its inverting terminal and will be saturated and turned off. It will remain off until the input voltage exceeds the magnitude of the predetermined threshold voltage. That is, since resistor 26 is equal to resistor 20, the output of the operational amplifier 16 will remain negative until the input pulse amplitude exceeds the threshold. At that time, the output of the operational amplifier 16 goes positive forward biasing diode 32 and turning on transistors 34 and 36. Operational amplifiers 16 and 18 now form a unity gain inverting loop so that the voltage at the noninverting input to the operational amplifier 18 is the same as the input voltage but inverted. As mentioned above, the loop is stabilized by the feedback capacitor 52 acting around operational amplifier 16. Diode 32 disconnects this feedback during switching of operational amplifier 16 so that switching speed is not degraded excessively. Resistors 40 and 58 and capacitor 66 now form an attenuating, time-averaging filter operating on the radiance profile signal to compute the scaled time average of that portion of the input that is higher than the threshold.

When the input recrosses the threshold, the scaled average is stored on capacitor 66 to form the threshold for the next pulse. For normal operation, the resulting voltage is higher than the minimum threshold voltage and therefore diode 72 is biased off and has no effect on the circuit operation. When transistor 36 turns on, a negative going pulse appears at its output which is effective to signal the attitude control circuit 14.

In the event the pulse height suddenly drops for a substantial time, it is desirable to prevent a long term lockout of the adaptive comparator 10. This is accomplished by the DC restoration circuit composed of capacitor 62, resistors 60, 64 and the gate of transistor 34. If the output of operational amplifier 16 is negative for a substantial time, as compared to the time constant of capacitor 62 and resistor 64, then the flow of current from ground through resistor 64 to capacitor 62 will return capacitor 62 to a ground potential and thereby turn on transistor 34. When transistor 34 is turned on, capacitor 66 can discharge through resistor 58 to ground. This will reset capacitor 66 to the minimum threshold. As mentioned above, this minimum threshold is selected by choosing the voltage divider of resistors 68 and 70 and a power supply of seven volts.

Also, as mentioned above, the adaptive comparator of the present invention responds to true differential input, thus providing common mode noise rejection and accommodating positive pulse sensors by means of input lead reversal. The output is provided at transistor 36. Capacitor 42 prevents the reverse recovery charge of diode 32 from pulling the voltage at the positive input of operational amplifier 18 below the threshold voltage on capacitor 66.

While the present invention has been described herein with reference to a particular embodiment, it is to be understood the the invention is not limited thereto. Those of ordinary skill in this art having access to the teachings of this invention may recognize modifications within the scope thereof. Accordingly, it is anticipated by the appended claims to cover any and all such modifications within the true spirit and scope of the present invention.

What is claimed is:

1. An adaptive comparator for use in combination with a horizon sensor, said sensor having means for detecting radiation from a celestial body and means for generating an output pulse in response thereto which serves as an input to said comparator, said comparator comprising:
   first circuit means for setting a predetermined input signal amplitude threshold;
   second circuit means for comparing said input signal to said threshold and for generating an output signal when said input signal exceeds said threshold;
   third circuit means coupled to said second circuit means for setting a second input signal amplitude threshold which corresponds to an average of that portion of recent input signals which exceeded the previous amplitude threshold; and
   fourth circuit means for resetting said third circuit means.

2. The adaptive comparator of Claim 1 wherein said first circuit means includes a first RC network with a first voltage divider network and a first capacitor.

3. The adaptive comparator of Claim 2 wherein said third circuit means includes a second RC network with a second voltage divider network and said first capacitor.

4. The adaptive comparator of Claim 3 wherein said means for resetting said third circuit means includes a resistor and a second capacitor connected to the control input of switch means; said switch means being connected to at least partially discharge said first capacitor when actuated.

5. The adaptive comparator of Claim 2 wherein said second circuit means includes a first differential input operational amplifier and said first circuit means further includes a second operational amplifier connected as a unity gain follower in a feedback path of said differential input operational amplifier.

6. An adaptive comparator for use in combination with a horizon sensor, said sensor having means for detecting radiation from a celestial body and means for generating an output pulse in response thereto which serves as an input to said comparator, said comparator comprising:
   a first circuit means for setting a predetermined input signal amplitude threshold, said first circuit means including a first RC network with a first voltage divider network and a first capacitor;
   second circuit means for comparing said input signal to said threshold and for generating an output signal when said input signal exceeds said threshold;
   third circuit means coupled to said second circuit means for setting a second input signal amplitude threshold which corresponds to an average of that portion of recent input signals which exceeded the previous amplitude threshold, said third circuit means including a second RC network with a second voltage divider network and said first capacitor; and
   fourth circuit means for resetting said third circuit means after said predetermined threshold has been exceeded.

7. The adaptive comparator of Claim 6 wherein said means for resetting said third circuit means includes a third resistor and a second capacitor connected to the control input of switch means; said switch means being connected to at least partially discharge said first capacitor when actuated.

8. An adaptive comparator for use in combination with a horizon sensor, said sensor having means for detecting radiation from a celestial body and means for generating an output pulse in response thereto which serves as an input to said comparator, said comparator comprising:
   first circuit means for setting a predetermined input signal amplitude threshold, said first circuit means including a first RC network with a first voltage divider network and a first capacitor;
   second circuit means for comparing said input signal to said threshold and for generating an output signal when said input signal exceeds said threshold, said second circuit means including a first differential input operational amplifier;
   third circuit means coupled to said second circuit means for setting a second input signal amplitude threshold which corresponds to an average of that portion of recent input signals which exceeded the previous amplitude threshold, said third circuit means including a second RC network with a second voltage divider network and said first capacitor; and
   fourth circuit means for resetting said third circuit means after said predetermined threshold has been exceeded, said fourth circuit means including a third RC network connected to the control input of switch means connected to at least partially discharge said first capacitor when actuated.

9. The adaptive comparator of Claim 8 wherein said first circuit means further includes a second operational amplifier connected as a unity gain follower in a feedback path of said differential input operational amplifier.

* * * * *